United States Patent [19]

Sakakibara

[11] Patent Number: 5,063,405
[45] Date of Patent: Nov. 5, 1991

[54] APPARATUS FOR FORMING IMAGES

[75] Inventor: Kenji Sakakibara, Ichinomiya, Japan

[73] Assignee: Brother Kogyo Kabushiki Kaisha, Nagoya Aichi, Japan

[21] Appl. No.: 588,583

[22] Filed: Sep. 25, 1990

[30] Foreign Application Priority Data

Oct. 18, 1989 [JP] Japan .................................. 1-271394

[51] Int. Cl.⁵ ........................ G03B 27/32; G03B 27/52
[52] U.S. Cl. ......................................... 355/32; 355/1; 355/27
[58] Field of Search ....................... 355/27, 32, 35, 30, 355/1; 354/297–304; 430/138

[56] References Cited

U.S. PATENT DOCUMENTS

| 4,399,209 | 8/1983 | Sanders et al. | 430/138 |
| 4,763,165 | 8/1988 | Watanabe | 355/328 |
| 4,769,675 | 9/1988 | Watanabe | 355/202 |
| 4,875,073 | 10/1989 | Ueda et al. | 355/27 |
| 4,896,183 | 1/1990 | Ohashi et al. | 355/27 |
| 4,943,826 | 7/1990 | Ohashi et al. | 355/27 |
| 4,982,225 | 1/1991 | Sakakibara et al. | 355/30 |

FOREIGN PATENT DOCUMENTS

| 58-88739 | 5/1983 | Japan . |
| 2042746A | 9/1980 | United Kingdom . |
| 2203255A | 10/1988 | United Kingdom . |
| 2203848A | 10/1988 | United Kingdom . |

Primary Examiner—5
Assistant Examiner—Richard A. Wintercorn
Attorney, Agent, or Firm—Oliff & Berridge

[57] ABSTRACT

The invention provides a color copying machine or apparatus for forming chromatic images which irradiates an original with rays from a light source, focuses the reflection from the original as latent images on a photosensitive recording medium, and forms chromatic images corresponding to the latent images on a copy sheet. The apparatus includes supplementary exposing means for irradiating a specified region on the photosensitive recording medium with desirable chromatic light. Thus the color of images on the region is desirably changed to make the region conspicuous or inconspicuous.

23 Claims, 5 Drawing Sheets

APPARATUS FOR FORMING IMAGES

BACKGROUND OF THE INVENTION

The present invention relates to an apparatus for forming images, and more particularly to a color photocopier which irradiates an original with rays from a light source, focuses the reflection from the original as latent images on a photosensitive recording medium, and forms chromatic images corresponding to the latent images on a copy sheet.

There are three different systems generally applied to color copying machines; silver salt system, electrophotographic system, and photosensitive, pressure sensitive system. In the photosensitive, pressure sensitive system, development and transfer are accomplished by one process. A special film (photosensitive, pressure sensitive paper) with numerous microcapsules, which respond to red, green and blue lights, is exposed to imaging light and images are transferred to and fixed on a developer sheet (See U.S. Pat. No. 4,399,209).

The color electrophotographic system and the photosensitive, pressure sensitive system utilize a photosensitive recording medium with lower sensitivity than the silver salt system. In these two systems, sufficient color gradation may be not obtained only with imaging light, and thus another exposing process, i.e., supplementary exposure, is required for improving the color gradation.

For executing supplementary exposure, a device is attached in the vicinity of a region exposed to imaging light; a photosensitive drum or the whole photosensitive, pressure sensitive paper is uniformly exposed to rays emitted from the device.

The device, however, controls the color of the whole images and thus cannot change only the color of specified part of the images. The color conversion only in a specified part is sometimes required to make the part conspicuous so as to make effective photocopies; for example, the color conversion of characters or symbols in a specified part from black into a desirable color. General electrophotographic systems or photosensitive, pressure sensitive systems, however, do not have such a function.

SUMMARY OF THE INVENTION

The objective of the invention is thus to provide apparatus for forming chromatic images or making photocopies in which the color of a specified region can be desirably converted.

The above and other related objectives are realized by apparatus for forming chromatic images that irradiates an original with rays from a light source, focuses the reflection from the original as latent images on a photosensitive recording medium, and forms chromatic images corresponding to the latent images on a copy sheet, including supplementary exposing means for irradiating a specified region on the photosensitive recording medium with desirable chromatic light.

The supplementary exposing means irradiates a specified region on the photosensitive recording medium with light of a desirable color while images are formed by image-wise exposure based on the reflection from an original. The latent images corresponding to the reflection of the original are formed on the photosensitive recording medium simultaneously with or shortly before or after the exposure of the specified region by the supplementary exposing means.

For example, when black latent images are formed on the photosensitive recording medium, if specified part of the photosensitive recording medium is irradiated with blue light sent from the supplementary exposing means, the color of the latent images on the specified part of the photosensitive recording medium changes from black into blue. The color of the ground on the photosensitive recording medium, i.e., white, does not change since the ground has already been exposed to blue, green, and red lights. Black images including a region of blue images are thereby formed on a copy sheet. A specified part of the photosensitive recording medium may be irradiated with blue light sent from the supplementary exposing means before the latent images are formed on the photosensitive recording medium based on the reflection of the black and white original. Through this process, the same resultant images are obtained; that is, images on the specified part irradiated with blue light remain blue and images on the other part become black. The same result is also obtained when irradiation with blue light is conducted while the latent images are being formed on the photosensitive recording medium.

The color conversion of images is performed to make specified part of images on a copy sheet conspicuous or inconspicuous. The color conversion is achieved irrespective of the color of the original; e.g., red and white instead of black and white. In the case of a red and white original, when specified part of the photosensitive recording medium is irradiated with green light simultaneously with or shortly before or after the formation of red latent images on the photosensitive recording medium, the resultant images of the irradiated part become yellow while images of the unirradiated part remain red. The color of the ground does not change but remains white on a copy sheet. When the specified part of red latent images are irradiated with the mixture of green and blue lights, the resultant images of the irradiated part become white like the color of the ground; images on the specified part are virtually eliminated.

BRIEF DESCRIPTION OF THE DRAWINGS

The invention may be best understood by referring to the following detailed description of a preferred embodiment and the accompanying drawings, wherein like numerals denote like elements and in which.

DETAILED DESCRIPTION OF PREFERRED EMBODIMENT

An embodiment of apparatus for forming images according to the invention is now described referring to the drawings.

Since there may be many modifications without departing from the scope of the invention, the embodiment below is not intended to limit the invention to the embodiment, but is intended to illustrate the invention more clearly.

Figure 1:
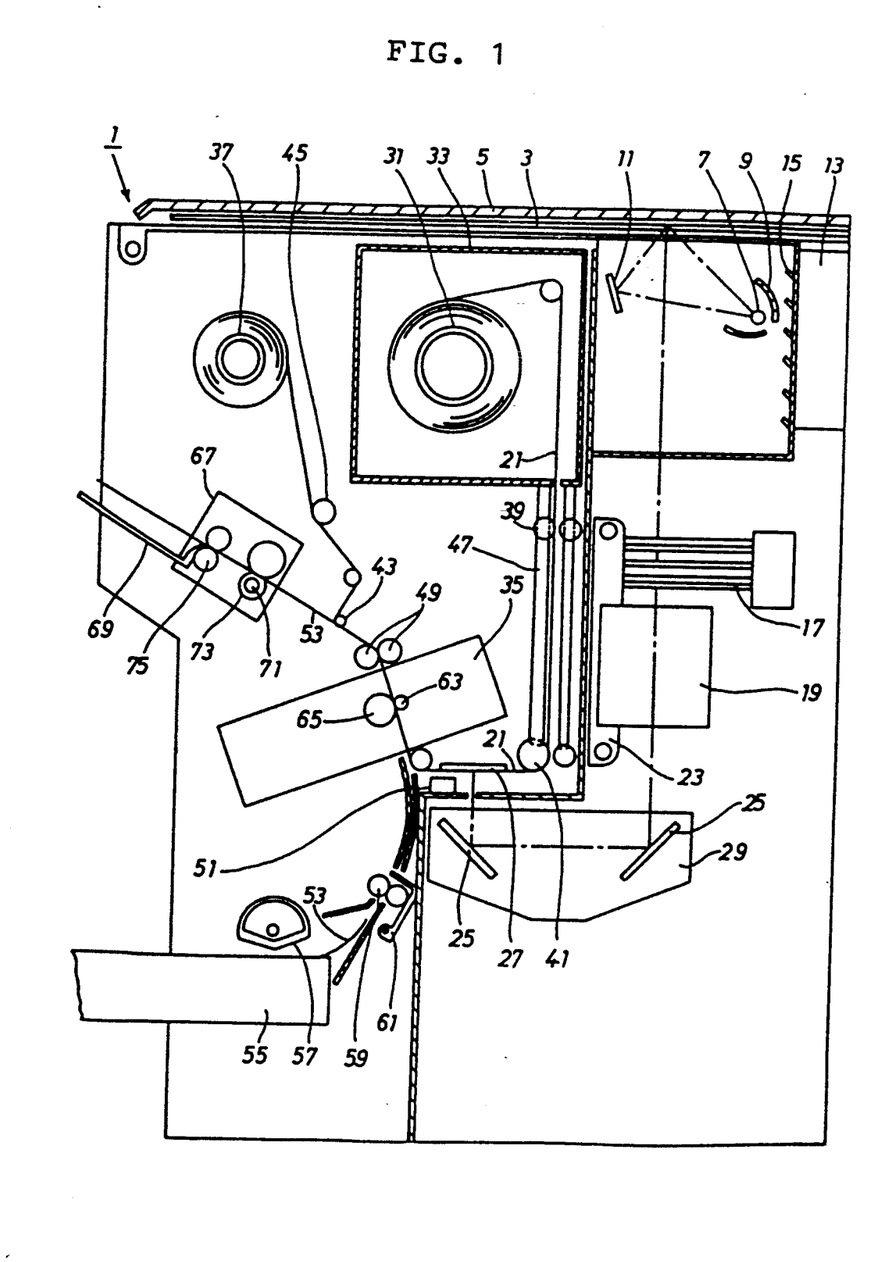
FIG. 1 is a schematic cross-sectional view of a photosensitive, pressure sensitive copying machine of an embodiment according to the invention.

FIG. 1 is a schematic cross-sectional view of a photosensitive, pressure sensitive copying machine 1 for making full color photocopies. Photosensitive pressure sensitive paper, i.e., a photosensitive recording medium, and a developer sheet, i.e., a copy sheet, both of which are essential for the full color photocopies, are not described here in detail; they are disclosed in, for example, the above-mentioned U.S. Pat. No. 4,399,209.

The photosensitive pressure sensitive copying machine 1 has a laterally slidable glass base 3 and a cover 5; an original (not shown) is faced down on the glass base 3. On the upper right portion of the copying machine 1, a light source is fixed to send rays in line to the glass base 3. The light source includes a halogen lamp 7 located at right angles to the sliding direction of the glass base 3 and an arc-shaped reflecting mirror 9 surrounding the halogen lamp 7.

The halogen lamp 7 successively irradiates the glass base 3 from the left end to the right end since the glass base 3 moves laterally. The rays sent from the light source pass through the transparent glass base 3 and are reflected by an original positioned face down on the glass base 3. The upper face of the glass base 3 is shielded with the cover 5, thus preventing rays from leaking through a part not covered with the original.

A reflector 11 is mounted on the left of the light source so as to utilize rays emitted from the halogen lamp 7 for irradiation of the original at a high efficiency. Namely rays which are emitted in various directions other than towards the original, are reflected by the reflector 11 so as to be effectively utilized for irradiation of the original. A fan 13 and a louver 15 are provided for ventilation on the right of the halogen lamp 7 and efficiently feed cooling air to the glass base 3. The rays emitted from the halogen lamp 7 and reflected by the original placed down on the glass base 3 pass through a filter 17 and enter a lens 19. The filter 17 changes the light permeability according to the sensitivity of photosensitive, pressure sensitive paper 21 and controls the tone of images photocopied. The lens 19 is fixed on a lens attachment 23 and is capable of performing fine angular control to the optical path.

The rays are converged by the lens 19, are turned twice by two reflecting mirrors 25 and are focused on the photosensitive, pressure sensitive paper 21 closely placed under an exposure stand 27. The two reflecting mirrors 25 are fixed on a mirror attachment 29. The optical path length and the focus of the rays are controlled by adjusting the position of the mirror attachment 29 adequately.

The continuous photosensitive, pressure sensitive paper 21 is rolled up on a cartridge roller 31 and is accommodated in a detachable cartridge 33 provided below the glass base 3. An end of the photosensitive, pressure sensitive paper 21 is led to a paper winding shaft 37 via plural rollers and a pressure developing unit 35.

The photosensitive, pressure sensitive paper 21 is drawn out from the lower portion of the cartridge 33, passes below the exposure stand 27 through a feed roller 39 and a drum roller 41 and is fed to the pressure developing unit 35. The paper 21 then passes through a separation roller 43 and a tension control roller 45 and is wound up onto the paper winding shaft 37. The photosensitive, pressure sensitive paper 21 drawn out from the cartridge 33 is protected with a shielding cover 47 to remain unexposed.

The feeding speed of the photosensitive, pressure sensitive paper 21 is controlled to be constant as well as to coincide with the shift speed of the glass base 3 by a photosensitive, pressure sensitive paper feed roller 49. When the photosensitive, pressure sensitive paper 21 passes through the exposure stand 27, latent images corresponding to each line of the original are formed successively on the photosensitive, pressure sensitive paper 21. After the latent images are formed, a specified region of the photosensitive, pressure sensitive paper 21 is further exposed to desirable chromatic light emitted from a supplementary exposing unit 51.

A developer sheet cassette 55 for accommodating developer sheets 53 is provided below the pressure developing unit 35. The developer sheets 53 are drawn out one by one by an arc-shaped roller 57. The position of the upper end of the developer sheet 53 is adjusted by a developer sheet roller 59 and a register gate 61. The developer sheet 53 is then fed together with the photosensitive, pressure sensitive paper 21 into a paper inlet of the pressure developing unit 35.

More specifically, the developer sheet 53 and the photosensitive pressure sensitive paper 21 closely contact each other and are fed into the pressure developing unit 35. The pressure developing unit 35 includes a small roller 63 and a back up roller 65. The developer sheet 53 and the photosensitive, pressure sensitive paper 21 are pressed between the small roller 63 and the back up roller 65 while the microcapsule applied surface of the photosensitive, pressure sensitive paper 21, i.e., the surface on which latent images are formed, is in contact with the developer-applied surface of the developer sheet 53. The unexposed microcapsules are ruptured by the pressure and the internal chromogenic composition is transferred to the developer sheet 53 to form chromatic images on the develop sheet 53.

The photosensitive, pressure sensitive paper 21 and the developer sheet 53 drawn out from the pressure developing unit 35 are transported by the photosensitive, pressure sensitive paper feed roller 49 and are separated by the separation roller 43, sending the photosensitive, pressure sensitive paper 21 upwards and the developer sheet 53 ahead. A thermal fixing unit 67 promotes the color development of the developer sheet 53 and eventually chromatic images are formed on the developer sheet 53. The developer sheet 53 with the face upward is then discharged to a paper tray 69. The thermal fixing unit 67 includes a hollow heat roller 73 accommodating a heater 71 therein and a developer sheet feed roller 75.

The operation of the photosensitive, pressure sensitive copying machine 1 is explained below. An original is placed down on the glass base 3 with the cover 5 open and the cover 5 is then closed. When a start button (not shown) is pressed, the glass base 3 slides rightwards in FIG. 1 and stops at the position where the left end of the glass base 3 faces the light source. The glass base 3 then moves back to the left with the halogen lamp 7 on. The rays emitted from the halogen lamp 7 are reflected by the original, pass through the filter 17 and the lens 19, are reflected by two reflecting mirrors 25 and are focused on the photosensitive, pressure sensitive paper 21 located closely under the exposure stand 27. Since the photosensitive, pressure sensitive paper 21 moves leftwards under the exposure stand 27 at the same speed as that of the glass base 3, latent images are formed on the photosensitive, pressure sensitive paper 21 corresponding to the reflection from the original. When the original is a black and white print, the latent images corresponding to a black color are formed.

A specified region of the photosensitive, pressure sensitive paper 21 is then irradiated with and exposed to light of a desirable color emitted from the supplementary exposing unit 51, and the color of the latent images in the region change from black to the desirable color.

With the leftward movement of the glass base 3, the developer sheet 53 is drawn out from the developer sheet cassette 55 by the arc-shaped roller 57 and is superposed upon the photosensitive, pressure sensitive paper 21 already exposed. They are then together fed into the pressure developing unit 35. The latent images on the photosensitive, pressure sensitive paper 21 are developed and transferred onto the developer sheet 53.

The developer sheet 53 is then thermally fixed by the thermal fixing unit 67 and is discharged from the copying machine 1. After passing through the pressure developing unit 35, the photosensitive, pressure sensitive paper 21 is wound up onto the paper winding shaft 37. When the glass base 3 slides to the position at which the right end of the glass base 3 faces the light source, the photocopy of the original is accomplished and the halogen lamp 7 goes out. The photocopied images of the part supplementarily exposed on the developer sheet 53 have a different color from the original.

Figure 2:
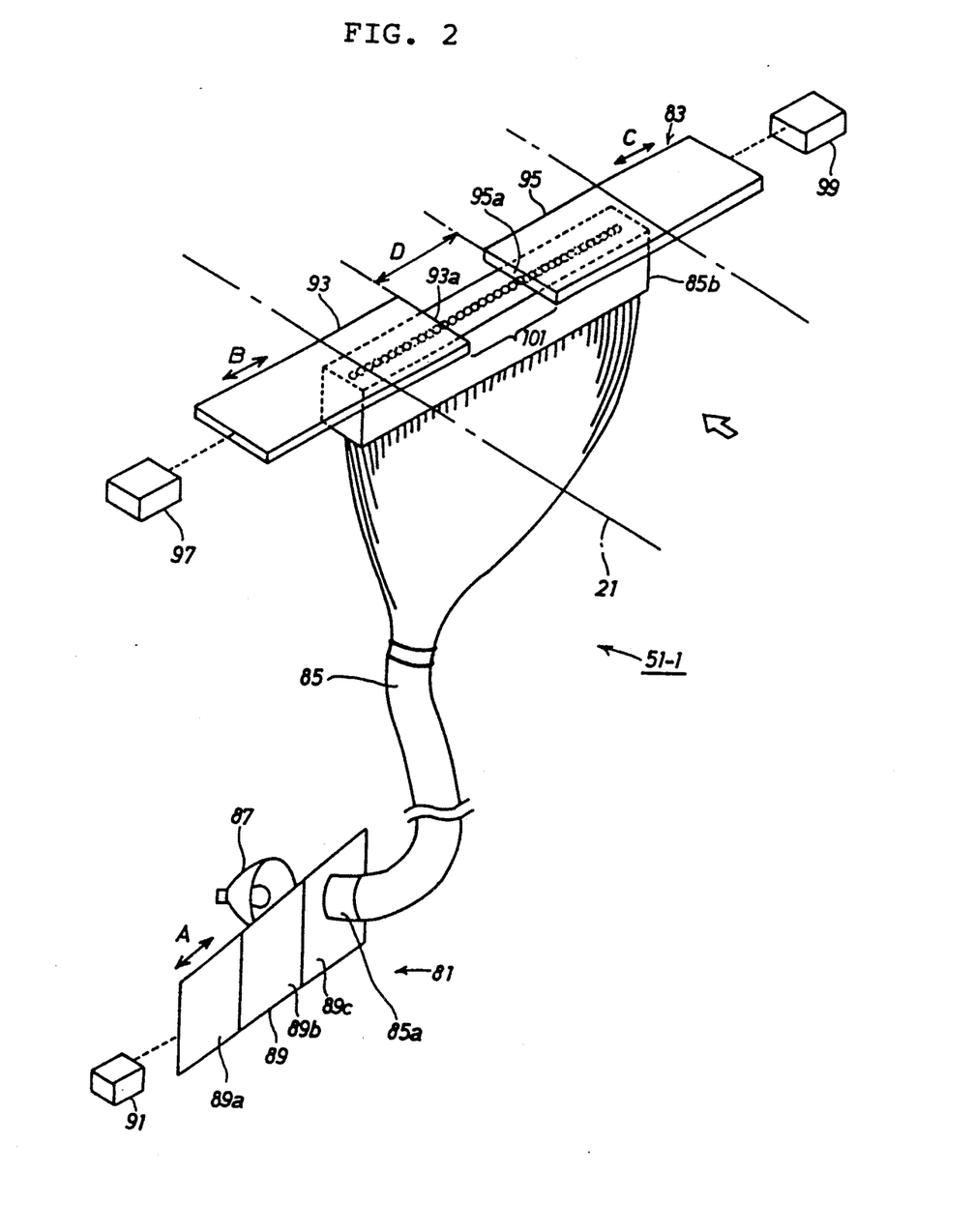
FIG. 2 is a perspective view illustrating a construction of the supplementary exposing unit of the embodiment.

Examples of the construction of the supplementary exposing unit 51 are explained based on FIGS. 2 though 6.

FIG. 2 is a perspective view illustrating a first example of the construction. A supplementary exposing unit 51-1 includes a chromogenic part 81, an emission part 83, and an optical fiber flux 85 connecting the chromogenic part 81 with the emission part 83 and leading the chromatic light for supplementary exposure from the chromogenic part 81 to the emission part 83. The chromogenic part 81 has a halogen lamp 87 with a reflector for supplementary exposure and a filter 89 for selecting a desirable chromogenic composition from rays emitted from the light source, i.e., the halogen lamp 87, to send the desirable chromogenic composition to an end 85a of the optical fiber flux 85. The filter 89 is movable in the direction shown by an arrow A with an actuator 91. By moving the filter 89, a desired filter portion is selected from a blue filter portion 89a, a green filter portion 89b, and a red filter portion 89c. The desired filter portion is then placed between the optical fiber flux end 85a and the halogen lamp 87 for supplementary exposure.

The emission part 83 includes two movable shutters 93 and 95 and actuators 97 and 99 for respectively moving the shutters 93 and 95 in the directions shown by arrows B and C. Since both the movable shutters 93 and 95 shift in the same direction (the directions of the arrows B and C), the width D of a clearance 101 between opposed ends 93a and 95a of the shutters 93 and 95 is changeable and also the position of the clearance 101 of the width D is shiftable in the directions of the arrows B and C.

The optical fiber flux 85 includes a fiber flux end connector 85b, which is provided on the emission side of the optical fiber flux 85, for disposing optical fibers in a line and fixing them. The photosensitive, pressure sensitive paper 21 moves at right angles to the disposed direction of the optical fibers. The position of the clearance 101 and its width D are adjusted with the actuators 97 and 99 corresponding to the movement of the photosensitive, pressure sensitive paper 21. Any specified region of the desirable width D on the shifting photosensitive, pressure sensitive paper 21 is then supplementarily exposed to desirable chromatic light.

Here is an example. First, a region is specified on the photosensitive, pressure sensitive paper 21 by determining the width D and the position of the clearance 101. Second, the specified region of the photosensitive, pressure sensitive paper 21 with black latent images formed thereon is supplementarily exposed to red light emitted from the supplementary exposing unit 51-1. Namely the specified belt-like region of the photosensitive, pressure sensitive paper 21 is supplementarily exposed. Black images including the belt-like region of red images are formed on the developer sheet 53 which has just passed through the pressure developing unit 35.

Another example of the operation is given. First, the shutters 93 and 95 are completely closed; that is, the width D of the clearance 101 is equal to zero. After the photosensitive, pressure sensitive paper 21 moves by a certain distance, the shutters 93 and 95 are opened to make the clearance 101. After a prescribed time period elapses, the shutters 93 and 95 are closed again. Then black images including the spot-like region of red images are formed on the developer sheet 53.

A further example of the operation is explained. The shutters 93 and 95 are opened to make the clearance 101 of a certain width. When the photosensitive, pressure sensitive paper 21 shifts by a certain distance, the halogen lamp 87 is turned on to emit red light for supplementary exposure. After the paper 21 further shifts by another certain distance, the halogen lamp 87 is turned off. Then black images including the spot-like region of red images are also formed on the developer sheet 53. The 'open' and 'shut' control of a shutter provided in the optical path may give the same effect as 'on' and 'off' of the halogen lamp 87 for supplementary exposure.

A desirable color and a region for the color are set through panel switches (not shown) provided on the photosensitive, pressure sensitive copying machine 1, stored in a control circuit (not shown), and read out for executing the supplementary exposure when the copying machine 1 is activated.

Figure 3:
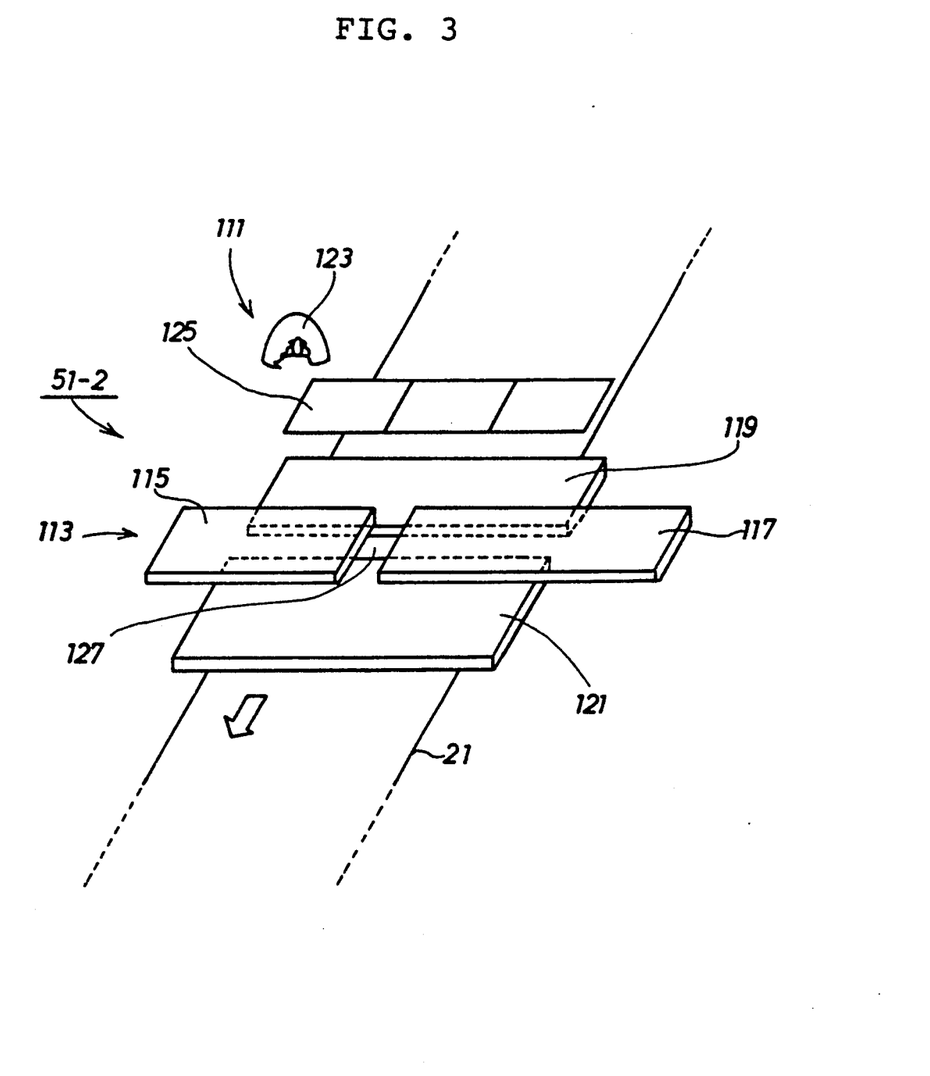
FIG. 3 is a perspective view illustrating another construction of the supplementary exposing unit of the embodiment.

FIG. 3 is a perspective view illustrating a second example of the construction, a supplementary exposing unit 51-2, and is shown upside down. The supplementary exposing unit 51-2 has a similar construction to that of the first example except for the following. The unit 51-2 includes only a chromogenic part 111 and an emission part 113 and not an optical fiber flux. The unit 51-2 includes four movable shutters; two 115 and 117 shiftable laterally and the other two 119 and 121 shiftable longitudinally.

Rays are emitted from a halogen lamp 123 for supplementary exposure. A desirable chromogenic composition is selected from the rays with a filter 125 and is sent to the emission part 113. The photosensitive, pressure sensitive paper 21 is irradiated with the rays of the desirable chromogenic composition through a clearance 127 made by the movable shutters 115, 117, 119 and 121.

The shutters 115 and 117 are movable at right angles to the direction of the movement of the photosensitive, pressure sensitive paper 21 with an actuator (not shown) as explained in the first example. The shutters 119 and 121 are movable in parallel with the direction of the movement of the photosensitive, pressure sensitive paper 21 with another actuator (not shown). The length, width and position of the clearance 127 may be determined to be any desirable values by adjusting the actuators. A differently colored rectangular region of a desirable area may be formed at any position on the photosensitive, pressure sensitive paper 21.

The process for forming a differently colored region of a desirable area at a desired position is explained according to FIGS. 4A through 4E.

The shutters 119 and 121 are longitudinally shifted and are completely closed; that is, the length of the clearance 127 is equal to zero. The shutters 115 and 117 are laterally shifted to make the clearance 127 of a predetermined width D2 (see FIG. 4A). At this stage, the photosensitive, pressure sensitive paper 21 is not supplementarily exposed.

A traveled distance of the photosensitive, pressure sensitive paper 21 is determined by an encoder (not shown). When the encoder determines that a predetermined region for supplementary exposure on the photosensitive, pressure sensitive paper 21 reaches the clearance 127, the shutter 121 starts shifting in the same direction and at the same speed as the photosensitive, pressure sensitive paper 21 to open the clearance 127 while the shutter 119 remains unmoved (see FIG. 4B).

Figure 4A:
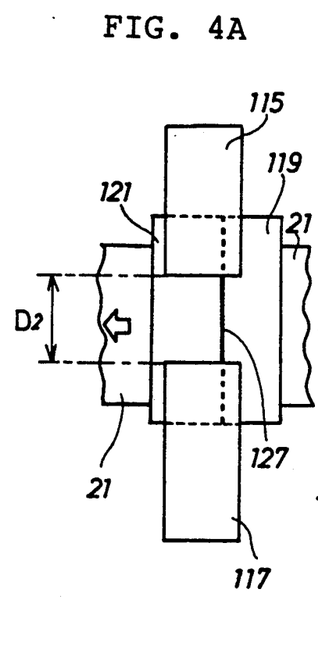
FIGS. 4A through 4E are top plan views illustrating the operation of FIG. 3.
Figures 4B, 4C:
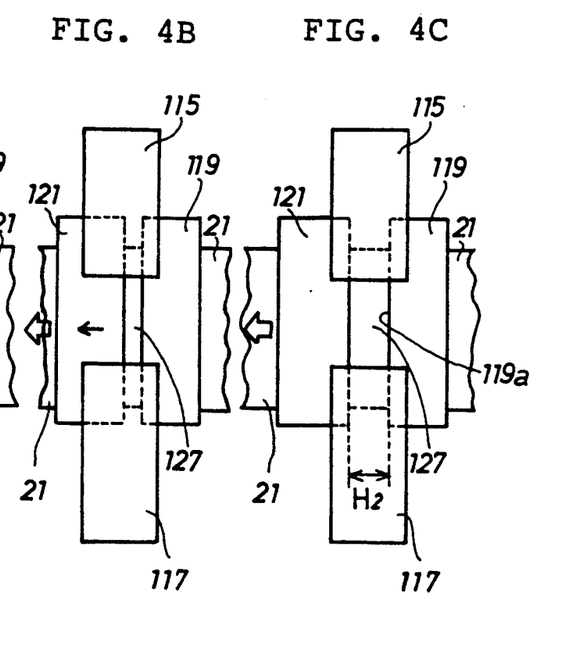

The shutter 121 is opened until the length of the clearance 127 becomes equal to a predetermined value H2 and then stops (see FIG. 4C). These shutter positions are maintained until the end of the predetermined region for supplementary exposure reaches an end 119a of the shutter 119.

Figure 4D:
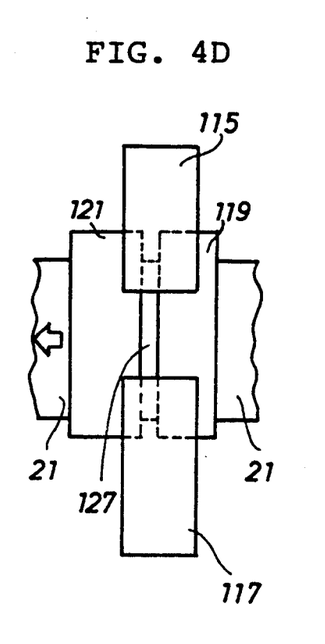
Figure 4E:
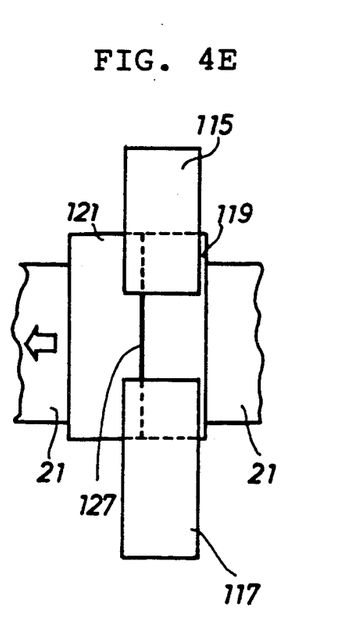

When the end of the predetermined region reaches the end 119a of the shutter 119, the shutter 119 starts shifting in the same direction and at the same speed as the photosensitive, pressure sensitive paper 21 to close the clearance 127 (see FIG. 4D). When the clearance 127 is completely blocked, the shutter 119 stops (see FIG. 4E).

As described above, the color of a specified region of latent images on the photosensitive, pressure sensitive paper 21 is changeable so as to make the region conspicuous. Though in the above example, the shutters 115 and 117 remain unmoved during supplementary exposure, they may be moved to vary the width D2 or the position of the clearance 127 in the lateral direction. Namely the shape of the specified region for supplementary exposure may be changed.

Figure 5:
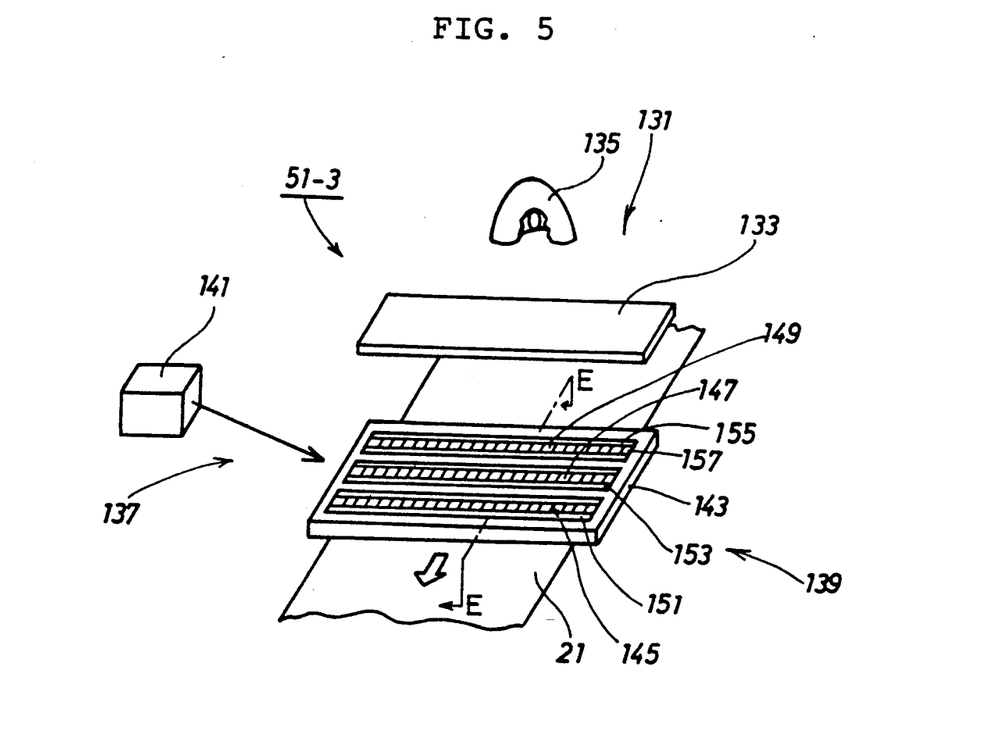
FIG. 5 is a perspective view illustrating another construction of the supplementary exposing unit of the embodiment.

FIG. 5 is a perspective view illustrating a third example of the construction, a supplementary exposing unit 51-3, and is shown upside down. The supplementary exposing unit 51-3 has a similar construction to that of the second example except the following. A chromogenic part 131 does not have a filter but a diffusion plate 133. Rays emitted from a halogen lamp 135 for supplementary exposure are diffused by the diffusion plate 133. An emission part 137 is uniformly exposed to the rays diffused. The emission part 137 includes a liquid crystal shutter array 139 and a driving circuit 141 for the array 139.

Figure 6:
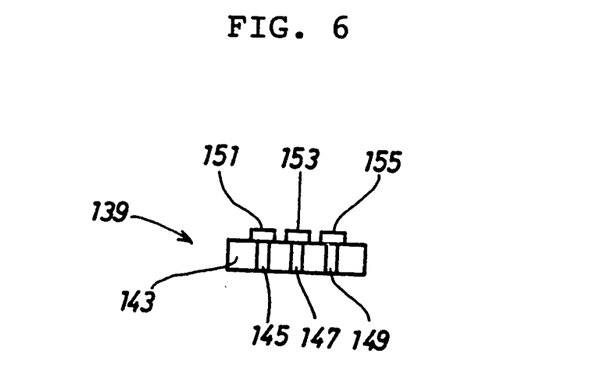
FIG. 6 is a cross-sectional view taken on line E—E of FIG. 5.

The liquid crystal shutter array 139 includes, as shown in FIG. 6, a base 143, three rows of liquid crystal arrays 145, 147 and 149 embedded through the base 143 and blue, green and red filters 151, 153 and 155 for respectively covering a face of the liquid crystal arrays 145, 147 and 149.

Each liquid crystal array 145, 147 or 149 consists of liquid crystal elements 157 (1 mm × 1 mm). The driving circuit 141 controls application of voltage onto an electrode of each liquid crystal element 157 corresponding to input data from a panel (not shown). Thereby each liquid crystal element 157 works for regulating the permeation of chromatic light.

More specifically, in the third example, the supplementary exposure with chromatic light is controllable by every liquid crystal element 157. A predetermined region at any desirable longitudinal or lateral position on the photosensitive, pressure sensitive paper 21 is supplementarily exposed to desirable chromatic light. Furthermore, supplementary exposure of two or more regions, especially positioned in a lateral line, on the paper 21 may be conducted simultaneously. Namely the color of latent images at plurality of desirable positions on the paper 21 is changeable at once. When the liquid crystal arrays 145, 147 and 149 are controlled corresponding to the movement of the photosensitive, pressure sensitive paper 21, one specified region may be supplementarily exposed to plural chromatic lights. Thus the resultant images on the copy sheet may be variously colored.

In the third example, the size of the liquid crystal element 157 is 1 mm × 1 mm. Since they are not used for forming images but used only for changing the color of a specified region, the size is sufficiently small and no smaller elements are required. The response speed of several hundreds ms is also sufficient for the purpose. Thus the copying machine of the invention is manufactured cheaply.

In the first and second examples of the supplementary exposing unit 51, the combination of a halogen lamp and a filter is used as a light source, and in the third example the combination of a halogen lamp and a diffusion plate is used. A cathode ray tube (CRT) like a fiber optical tube (FOT) may be used for the supplementary exposing unit. It directly sends chromatic light to a desirable position, thus making the construction of the supplementary exposing unit simpler.

In the embodiment, supplementary exposure is executed for part of black latent images; but other colored latent images may also be exposed in the same manner. For example, when part of red latent images are exposed to green light, the resultant images of the part are yellow. When part of magenta latent images are exposed to green light, the resultant images are white; images of the part are virtually eliminated.

Though supplementary exposure is executed after the formation of latent images in the above embodiment, it may be before or during the formation of latent images.

As described above, in the copying machine or photocopier of the invention, the supplementary exposing means is used for irradiating a specified region on the photosensitive recording medium with desirable chromatic light. Thereby the color of images on the region is desirably changed to make the region conspicuous or inconspicuous.

What is claimed is:

1. An image forming apparatus for forming chromatic images on a copy sheet, comprising:
    a light source for illuminating an original;
    a photosensitive recording medium;
    focusing means for focusing light reflected from the original onto the photosensitive recording medium to form a latent image on the photosensitive recording medium;
    supplementary exposing means for irradiating a desired area on the photosensitive recording medium with a desired chromatic light to convert the color of the image only in the desired area, the desired area irradiated by said supplementary exposing means being smaller than the area onto which light is reflected from the original; and image transferring means for forming chromatic images on the copy sheet corresponding to the latent image on the photosensitive recording medium.

2. The image forming apparatus of claim 1, in which the supplementary exposing means comprises shutter means for allowing chromatic light to illuminate only the desired area on the photosensitive recording medium.

3. The image forming apparatus of claim 2, in which the shutter means comprises a liquid crystal element for selectively blocking light from reaching and allowing light to pass through to the photosensitive recording medium.

4. The image forming apparatus of claim 2, in which the supplementary exposing means further comprises a chromatic lighting means, where the shutter means are located between the chromatic lighting means and the photosensitive recording medium.

5. The image forming apparatus of claim 4, in which the supplementary exposing means further comprises a plurality of optical fibers through which light is sent from the chromatic lighting means to the shutter means.

6. The chromatic forming apparatus of claim 1 in which the supplementary exposing means further comprises a plurality of optic fibers through which light is sent from a chromatic lighting means to the photosensitive recording medium.

7. The image forming apparatus of claim 1, in which the supplementary exposing means comprises:
 a supplementary light source; and
 filter means placed between the supplementary light source and the photosensitive recording medium for allowing chromatic light to pass from the supplementary light source to the photosensitive recording medium.

8. The image forming apparatus of claim 6, in which the filter means comprises a plurality of filters of different colors, where each filter may be selectively placed between the supplementary light source and the photosensitive recording medium to allow different colors of chromatic light to reach the photosensitive recording medium.

9. The image forming apparatus of claim 1, in which the supplementary exposing means comprises:
 a supplementary light source;
 a plurality of filters of different colors, where each filter may be selectively placed between the supplementary light source and the photosensitive recording medium to allow different colors of chromatic light to reach the photosensitive recording medium; and
 shutter means for allowing chromatic light passed through the filter means to illuminate only the desired area on the photosensitive recording medium.

10. The image forming apparatus of claim 9, in which the supplementary exposing means further comprises a plurality of optical fibers through which light is sent from the filter means to the shutter means.

11. The image forming apparatus of claim 9, in which the shutter means comprises liquid crystal elements for selectively blocking light from reaching or allowing light to pass through to the photosensitive recording medium.

12. The image forming apparatus of claim 1, in which the supplementary exposure means comprises:
 chromatic lighting means;
 a plurality of optical fibers for conducting light generated by the chromatic light means to the photosensitive recording medium
 shutter means for blocking light conducted through the optical fibers from reaching the photosensitive recording medium; wherein
 the chromatic image forming apparatus moves the photosensitive recording medium past the shutter means in an exposure direction;
 first ends of the optical fibers receive light from the chromatic light means and second ends of the optical fibers are arranged in a line across the photosensitive recording medium transverse to the exposure direction; and
 the shutter means are arranged at the second ends of the optical fibers to block light leaving the second ends of certain optical fibers such that chromatic light is allowed to illuminate only a desired area of the photosensitive recording medium.

13. The image forming apparatus of claim 12, in which the shutter means comprises:
 first and second opaque boards arranged to move along a line transverse to the exposure direction between the photosensitive recording medium and the second ends of the optical fibers; and
 driving means to move the first and second opaque boards.

14. The image forming apparatus of claim 13, in which the chromatic lighting means comprises:
 a supplementary light source; and
 filter means placed between the supplementary light source and the first ends of the optical fibers for allowing chromatic light to pass from the supplementary light source to the first ends of the optical fibers.

15. The image forming apparatus of claim 14, in which the filter means comprises a plurality of filters of different colors, where each filter may be selectively placed between the supplementary light source and the photosensitive recording medium to allow different colors of chromatic light to reach the photosensitive recording medium.

16. The image forming apparatus of claim 1, in which the supplementary exposure means comprises:
 chromatic lighting means; and
 shutter means for blocking light emitted by the chromatic lighting means from reaching the photosensitive recording medium; wherein
 the chromatic image forming apparatus moves the photosensitive recording medium past the shutter means in an exposure direction; and
 the shutter means are arranged to create a clearance area through which chromatic light passes such that chromatic light is allowed to illuminate only a desired area of the photosensitive recording medium.

17. The image forming apparatus of claim 16, in which the shutter means comprises:
 first and second opaque boards arranged to move along a line transverse to the exposure direction between the chromatic lighting means and the photosensitive recording medium;

third and fourth opaque boards arranged to move along a line parallel to the exposure direction between the chromatic lighting means and the photosensitive recording medium; and driving means for moving the first through fourth opaque boards; wherein the clearance area is a gap formed by the first through fourth opaque boards.

18. The image forming apparatus of claim 17, in which the chromatic lighting means comprises:

a supplementary light source; and filter means placed between the supplementary light source and the first ends of the optical fibers for allowing chromatic light to pass from the supplementary light source to the first ends of the optical fibers.

19. The image forming apparatus of claim 18, in which the filter means comprises a plurality of filters of different colors, where each filter may be selectively placed between the supplementary light source and the photosensitive recording medium to allow different colors of chromatic light to reach the photosensitive recording medium.

20. The image forming apparatus of claim 1, in which the supplementary exposure means comprises:

lighting means; and liquid crystal shutter means for blocking or passing light emitted by the lighting means from reaching the photosensitive recording medium; wherein the chromatic image forming apparatus moves the photosensitive recording medium past the shutter means in an exposure direction; and the liquid crystal shutter means is arranged in a line transverse to the exposure direction and actuated such that light is allowed to illuminate only a desired area of the photosensitive recording medium.

21. The image forming apparatus of claim 20, in which the liquid crystal shutter means comprises;

three arrays of liquid crystal elements; and three color filters, one color filter being associated with each liquid crystal element; wherein each array of liquid crystal elements and the color filter associated therewith are arranged in a line transverse to the exposure direction; and each liquid crystal element may be selectively actuated to block or pass light irradiated by the lighting means, thereby allowing chromatic light to illuminate only the desired area.

22. The image forming apparatus of claim 21, in which the supplementary exposure means further comprises a diffusion plate between the lighting means and the liquid crystal shutter means, where the light irradiated by the lighting means are diffused by the diffusion plate.

23. The image forming apparatus of claim 1, wherein said focusing means forms one of a black latent image and a colored latent image on said photosensitive recording medium and said supplementary exposing means irradiates a desired area of one of the black latent image and the colored latent image with said desired chromatic light.

* * * * *